(12) United States Patent
Niiyama et al.

(10) Patent No.: US 9,006,958 B2
(45) Date of Patent: Apr. 14, 2015

(54) PIEZOELECTRIC DEVICE

(75) Inventors: Takahiro Niiyama, Kagoshima (JP);
Hironobu Shintoku, Kagoshima (JP);
Ryoma Sasagawa, Kagoshima (JP);
Jumpei Komura, Kagoshima (JP)

(73) Assignee: Kyocera Crystal Device Corporation, Tokyo (JP)

( * ) Notice: Subject to any disclaimer, the term of this patent is extended or adjusted under 35 U.S.C. 154(b) by 376 days.

(21) Appl. No.: 13/697,434

(22) PCT Filed: Aug. 31, 2012

(86) PCT No.: PCT/JP2012/072152
§ 371 (c)(1),
(2), (4) Date: Nov. 12, 2012

(87) PCT Pub. No.: WO2013/031944
PCT Pub. Date: Mar. 7, 2013

(65) Prior Publication Data
US 2013/0140947 A1 Jun. 6, 2013

(30) Foreign Application Priority Data

Aug. 31, 2011 (JP) .................................. 2011-188447
Apr. 27, 2012 (JP) .................................. 2012-102901

(51) Int. Cl.
*H01L 23/00* (2006.01)
*H01L 23/13* (2006.01)
*H03H 9/05* (2006.01)

(52) U.S. Cl.
CPC ................ *H01L 24/81* (2013.01); *H01L 24/16* (2013.01); *H01L 2224/10175* (2013.01); *H01L 2224/831* (2013.01); *H01L 2224/8138* (2013.01); *H01L 24/11* (2013.01); *H01L 24/13* (2013.01); *H01L 24/83* (2013.01); *H01L 2224/1132* (2013.01); *H01L 2224/13111* (2013.01); *H01L 2224/16227* (2013.01); *H01L 2224/16238* (2013.01); *H01L 2224/73204* (2013.01);
(Continued)

(58) Field of Classification Search
CPC ... H01L 41/053; H03H 9/1021; H03H 9/0514
USPC ......................................... 310/314, 344, 348
See application file for complete search history.

(56) References Cited

U.S. PATENT DOCUMENTS 7,427,823 B2 * 9/2008 Ohshima et al. ............... 310/344
8,093,785 B2 * 1/2012 Wada ............................. 310/340

(Continued)

FOREIGN PATENT DOCUMENTS

JP          2009-267866 A          11/2009

*Primary Examiner* — Derek Rosenau
*Assistant Examiner* — Bryan Gordon
(74) *Attorney, Agent, or Firm* — Westerman, Hattori, Daniels & Adrian, LLP (57) ABSTRACT

A piezoelectric device 100 is provided with an element-mounting member 110, a piezoelectric element 120 mounted on the element-mounting member 110, a metal pattern 118 which is formed at the surface of the element-mounting member 110 and includes an element-mounting region 118a and a lead region 118b, and an integrated circuit element 130 which is electrically connected to the element-mounting region 118a of the metal pattern 118 by solder bump 132, wherein the metal pattern 118 has a projecting part 119 which is provided between the element-mounting region 118a and the lead region 118b, and at least the surface portion of the projecting part 119 is made of a metal oxide.

7 Claims, 7 Drawing Sheets

(52) U.S. Cl.
CPC ............... *H01L 2224/81191* (2013.01); *H01L 2224/81385* (2013.01); *H01L 2224/81439* (2013.01); *H01L 2224/81444* (2013.01); *H01L 2224/81815* (2013.01); *H03H 9/0514* (2013.01); *H03H 9/0547* (2013.01); *H03H 9/0552* (2013.01); *H01L 2924/3841* (2013.01); *H01L 23/13* (2013.01); *H01L 2224/16225* (2013.01)

(56) References Cited

U.S. PATENT DOCUMENTS

| | | | |
|---|---|---|---|
| 2006/0170305 A1* | 8/2006 | Ohshima et al. | 310/311 |
| 2007/0126519 A1* | 6/2007 | Mizumura et al. | 331/158 |
| 2009/0066426 A1* | 3/2009 | Harima et al. | 331/44 |

* cited by examiner

PIEZOELECTRIC DEVICE

TECHNICAL FIELD

The present invention relates to a piezoelectric device which is used in electronic equipment etc.

BACKGROUND ART

In the past, various types of piezoelectric devices have been used in for example portable electronic equipment. A conventional piezoelectric device includes an element-mounting member, a piezoelectric element accommodated in a first recessed part of the element-mounting member, and an integrated circuit element accommodated in a second recessed part of the element-mounting member.

The element-mounting member is provided with metal patterns for mounting the integrated circuit element. The integrated circuit element is joined with the metal patterns by solder bumps. The solder bumps are melted in a heating process and then cooled to solidify.

CITATIONS LIST

Patent Literature

Patent Literature 1: Japanese Patent Publication No. 2009-267866 A1

SUMMARY OF INVENTION

Technical Problem

However, in a conventional piezoelectric device, for example, sometimes about 250° C. heating process such as reflow was carried out multiple times after joining the integrated circuit element and the metal patterns by the solder bumps, so the solder bumps sometimes remelted. As a result, the remelted solder bumps sometimes spread over the metal patterns, so the reliability for the joints between the integrated circuit element and the metal patterns sometimes fell.

Solution to Problem

A piezoelectric device according to a first aspect of the present invention includes an element-mounting member, a piezoelectric element which is mounted on the element-mounting member, a metal pattern which is formed on the surface of the element-mounting member, and an integrated circuit element which is electrically connected to the metal pattern by a solder bump. the metal pattern includes an element-mounting region and a lead region. The integrated circuit element is electrically connected to the element-mounting region of the metal pattern. A metal pattern has a projecting part provided between the element-mounting member and the lead region, and at least the surface portion of the projecting part is made of a metal oxide.

A piezoelectric device according to a second aspect of the present invention includes an element-mounting member, a piezoelectric element mounted on the element-mounting member, a metal pattern which is provided on the surface of the element-mounting member and includes an element-mounting region and an interconnect region, and an integrated circuit part which is electrically connected to the element-mounting region of the metal pattern by a solder bump and which includes an integrated circuit element and a conductor pattern which is provided on an edge portion of the bottom surface of the integrated circuit element. The metal pattern further includes solder flow preventing region provided between the element-mounting region and the interconnect region. The solder flow preventing region is provided at position where it overlaps the conductor pattern of the integrated circuit part or at the inner side other than the conductor pattern in a plan view.

Advantageous Effects of Invention

In the piezoelectric device according to the first aspect of the present invention, the spread of the melted solder bump is suppressed at the projecting part which has at least surface portion which are made of a nickel (Ni) or other low solder wettability metal oxide. As a result, the reliability concerning the joined part of the integrated circuit element and the metal pattern is improved.

In the piezoelectric device according to the second aspect of the present invention, the possibility of the solder contacting the conductor pattern is reduced, so the possibility of short-circuiting of a plurality of electrode pads of the integrated circuit element is reduced.

DESCRIPTION OF EMBODIMENTS

Below, illustrative embodiments of the present invention will be explained with reference to the drawings.

First Embodiment

Figure 1:
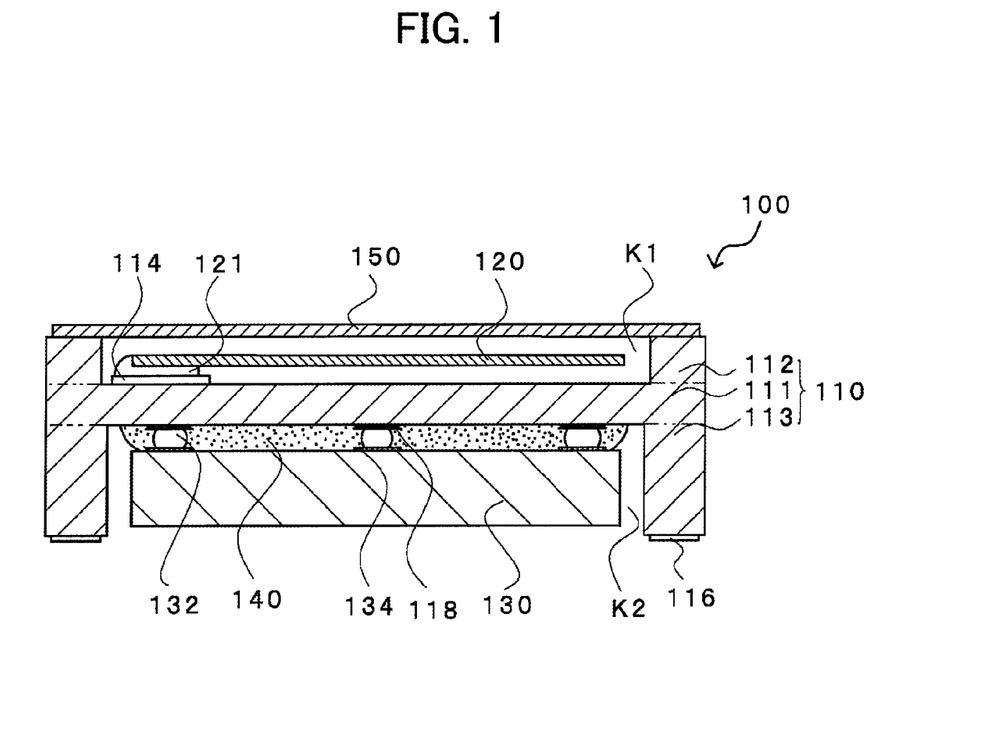
FIG. 1 is a cross-sectional view which shows an example of a piezoelectric device in a first embodiment of the present invention.

As shown in FIG. 1, a piezoelectric device 100 in a first embodiment of the present invention includes an element-mounting member 110, a piezoelectric element 120 and an integrated circuit element 130 which are mounted on the element-mounting member 110, and a lid member 150. Note that, FIG. 1 shows a vertical cross-sectional view along A-A in the piezoelectric device shown in FIG. 2.

The element-mounting member 110 includes a substrate section 111, a first frame section 112 provided on one major surface of the substrate section 111, and a second frame section 113 provided at the other major surface of the substrate section 111. The substrate section 111, first frame section 112, and second frame section 113 which configure the element-mounting member 110 are made of for example a ceramic material such as glass-ceramic, alumina ceramic or the like.

Figure 2:
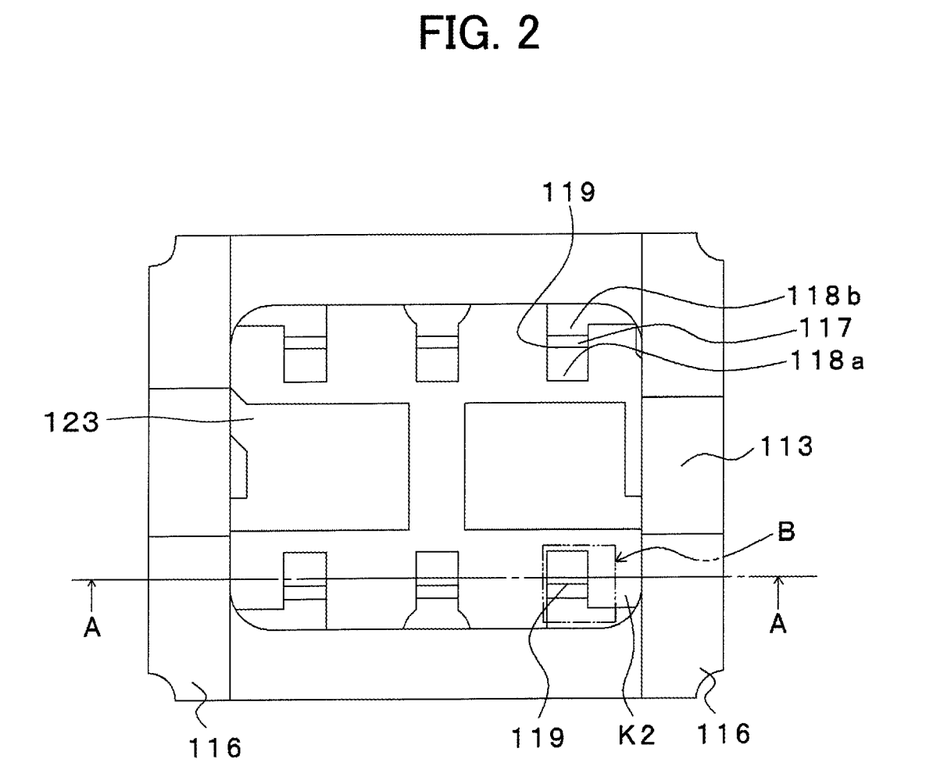
FIG. 2 is a bottom surface view of an element-mounting member of the piezoelectric device which is shown in FIG. 1.

Further, in the substrate section 111, a piezoelectric element mount-use pattern 114 for mounting the piezoelectric element 120 is arranged on one major surface, and metal patterns 118 for mounting the integrated circuit element 130 are arranged at the other major surface. Note that, at the other major surface, a monitor-use terminal 123 for inspecting the piezoelectric element 120 in a manufacturing process of the piezoelectric device 100 is provided as well. Further, as shown in FIG. 2, for example six metal patterns 118 consisting of 3 rows and 2 columns are arranged at the other major surface of the substrate section 111. FIG. 1 shows a cross-sectional view cutting across one column of the metal patterns 118. The metal patterns 118 arranged at the element-mounting member 110 are joined with electrode pads 134 of the integrated circuit element 130 which will be explained later through solder bumps 132. Further, inside the substrate section 111, inner layer interconnects (not shown) are disposed. The piezoelectric element mount-use pattern 114 and the metal patterns 118 are electrically connected through the inner layer interconnects (not shown).

Further, the element-mounting member 110 has a first recess K1 surrounded by the substrate section 111 and the first frame section 112. In the first recess K1, the piezoelectric element 120 is accommodated. The first recess K1 having the piezoelectric element 120 accommodated therein is hermetically sealed by the lid member 150.

Further, the element-mounting member 110 has a second recess K2 surrounded by the substrate section 111 and the second frame section 113. In the second recess K2, the integrated circuit element 130 is accommodated. At four corners of the second frame section 113, a plurality of external connection terminals 116 are provided. The plurality of external connection terminals 116 individually function as a VCC terminal, a VCON terminal, an OUT terminal, and a ground terminal.

To the VCC terminal, a power supply voltage is applied. To the VCON terminal is applied a signal for controlling the output state of the integrated circuit element 130 (that is, a control signal). To the OUT terminal is applied a signal output from the integrated circuit element 130. To the ground terminal is applied a ground voltage.

The piezoelectric element 120 has a structure having an excitation-use electrode (not shown) and a connection-use electrode (not shown) provided on the two major surfaces of the piezoelectric element sheet. Further, the connection-use electrode (not shown) of the piezoelectric element 120 is connected through a conductive binder 121 to the piezoelectric element mount-use pattern 114 arranged on the element-mounting member 110. Further, in the piezoelectric element 120, when a fluctuating voltage from the outside is applied to the piezoelectric element sheet cut at a predetermined crystal axis, a thickness-slip vibration having a predetermined frequency is excited. As the piezoelectric element sheet, use is made of for example crystal.

The integrated circuit element 130 has a structure provided with at least an oscillation circuit. In the integrated circuit element 130, the electrode pads 134 are formed on the surface on which the circuits are formed. The electrode pads 134 are joined through the solder bumps 132 to metal patterns 118 arranged at the element-mounting member 110. Further, between the electrode pads 134 of the integrated circuit element 130, and the metal patterns 118 arranged at the element-mounting member 110, a resin 140 is filled.

The solder bumps 132 are formed by screen printing on the electrode pads 134 on the surface of the integrated circuit element 130 on the side where the circuits are formed and are formed in sizes of a bump diameter of for example about 80 to 100 μm and a height of for example about 60 to 100 μm. Further, as the solder bumps 132 used in the present embodiment, use is made of lead-free solder having for example an Sn—Cu—Ni composition.

The lid member 150 hermetically seals the first recess K1 formed by the substrate section 111 and first frame section 112. The material of the lid member 150 is for example 42Alloy or Kovar, phosphor bronze, or the like.

Here, as shown in FIG. 1 and FIG. 2, the metal patterns 118 arranged at the element-mounting member 110 of the piezoelectric device 100 are provided with element-mounting regions 118a and lead regions 118b. To the element-mounting regions 118a, the solder bumps 132 are electrically connected.

The lead regions 118b are connected to the inner layer interconnects (not shown) of the element-mounting member 110. Then, for example, four among the six lead regions 118b are connected through the inner layer interconnects (not shown) etc. to four external connection terminals 116, and the remaining two are connected through the inner layer interconnects (not shown) etc. to the piezoelectric element mount-use pattern 114. Note that, the lead regions 118b connected to the piezoelectric element mount-use pattern 114 are connected through the inner layer interconnects (not shown) to the monitor-use terminal 123 as well.

Figure 3:
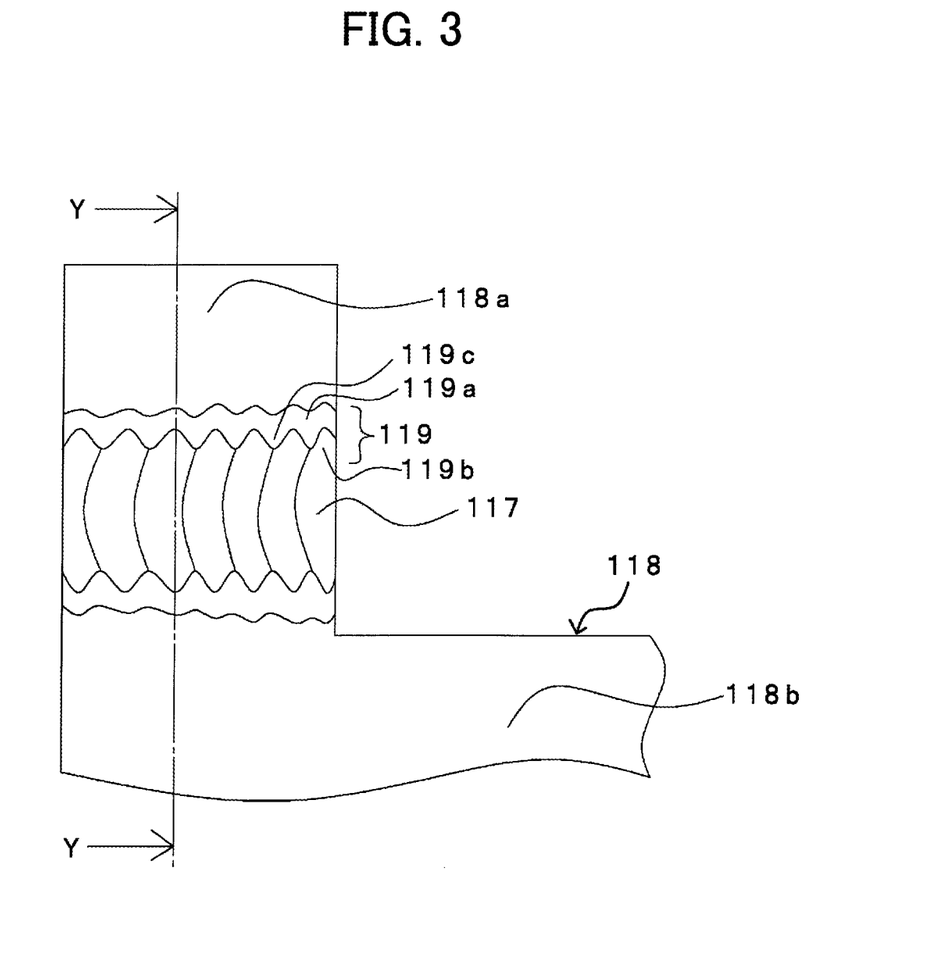
FIG. 3 is an enlarged view of a portion which is shown by notation B in FIG. 2.
Figure 4:
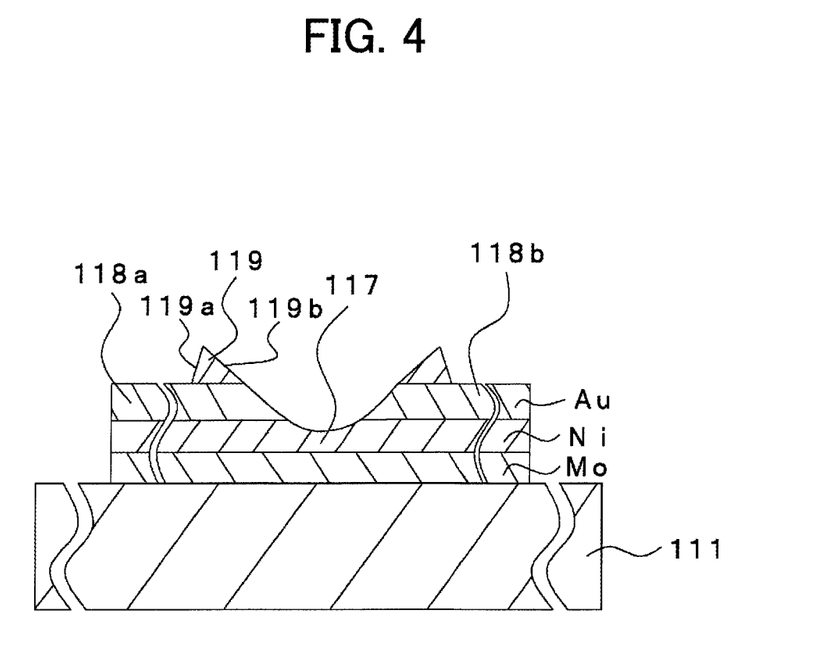
FIG. 4 is a vertical cross-sectional view taken along a Y-Y line in FIG. 3.

Further, each metal pattern 118 has, as shown in FIG. 3 and FIG. 4, a projecting part 119 which is provided between the element-mounting region 118a and the lead region 118b. At least the surface portion of the projecting part 119 is made of a metal oxide. Due to this, the piezoelectric device 100 in the present embodiment can suppress the spread of the solder forming the solder bumps 132 by the physical action that the projecting part 119 becomes a dam and the chemical action that the metal oxide is difficult to wet.

Further, FIG. 4 shows an enlarged view of a cross-section of the metal pattern 118 of the piezoelectric device 100 in the present embodiment. The metal pattern 118 in the present embodiment has a structure provided with the projecting part 119 disposed between the element-mounting region 118a and the lead region 118b. The metal pattern 118 has a 3 layer-structure, in which, for example molybdenum (Mo) is formed in a bottom layer, for example nickel (Ni) is formed in an intermediate layer, and for example gold (Au) is formed in a top layer.

The projecting part 119 in the piezoelectric device 100 in the present embodiment is formed by irradiating a laser on the metal pattern 118 and cutting for example the nickel (Ni) in the intermediate layer and for example gold (Au) in the top layer in the metal pattern 118 and providing a groove portion 117 in the metal pattern 118. The metal oxide of the projecting part 119 is formed by for example nickel (Ni) in the intermediate layer of the metal pattern 118 being shaved off by the laser and generates heat and reacts with air. Further, the projecting part 119 in the present embodiment has a structure having an element-mounting region side surface 119a on the side by the element-mounting region 118a in the metal pattern 118 and having a lead region side surface 119b on the side by the lead region 118b.

Further, FIG. 3 shows an enlarged view of the top surface of the metal pattern 118 of the piezoelectric device 100 in the present embodiment. The metal pattern 118 in the present embodiment has a structure provided with the projecting part 119 which is disposed between the element-mounting region 118a and the lead region 118b and the groove portion 117 which is formed on the side by the lead region 118b other than the projecting part 119. Here, the projecting part 119 in the piezoelectric device 100 in the present embodiment has a structure where the element-mounting region side surface 119a formed on the side by the element-mounting region 118a has a plurality of recesses 119c, and each of the plurality of recesses 119c is recessed so as to become narrower toward the direction of the lead region 118b when viewed on a plane. Further, in the groove portion 117, a pattern by a plurality of minute rugged shapes is formed. The plurality of minute rugged shapes in the groove portion 117, when viewed on a plane, have curve patterns whereby flow of the solder is prevented if the solder flows out from the element-mounting region 118a to the direction of the lead region 118b.

In the projecting part 119 of the piezoelectric device 100 in the present embodiment, the height is for example about 1 to 2 μm, the depth of the groove portion 117 is for example about 0.5 to 1 μm, and the width of the groove portion 117 is for example about 30 to 50 μm. Further, when the projecting part 119 of the piezoelectric device 100 in the present embodiment is formed by for example irradiation of a laser, the height or inclination is adjusted by changing a spot diameter or output strength of the laser etc. In the same way, the shape of the plurality of recesses 119c, and the width or depth of the groove portion 117 can be adjusted by changing the spot diameter or output strength of the laser etc. Here, as the laser, use is made of for example a carbon dioxide laser, YAG laser, YVO4 laser, semiconductor laser, or excimer laser.

In this way, the metal pattern 118 which is arranged at the element-mounting member 110 of the piezoelectric device 100 in the present embodiment has the projecting part 119 provided between the element-mounting region 118a and the lead region 118b. At least the surface portion of the projecting part 119 is made of metal oxide. Due to this, the piezoelectric device 100 in the embodiment of the present invention can suppress the spread of the melted solder bumps 132 at the projecting part 119 since the metal oxide of the projecting part 119 is made of for example nickel (Ni) or other oxidized metal which has a low solder wettability. As a result, the piezoelectric device 100 in the present embodiment can secure the area for the joint portions between the electrode pads 134 of the integrated circuit element 130 and the solder bumps 132 and can suppress the drop of the bond strength of the solder bumps 132.

Further, the projecting part 119 of the piezoelectric device 100 in the present embodiment has an element-mounting region side surface 119a and has a plurality of recesses 119c in the element-mounting region side surface 119a. Each of the plurality of recesses 119c is recessed so as to become narrower toward the direction of the lead region 118b when viewed on a plane. Due to this, when the solder bumps 132 are melted in the heating process and spread from the element-mounting region 118a, the spread of solder can be suppressed by surface tension of the solder.

Further, the projecting part 119 of the piezoelectric device 100 in the present embodiment has the element-mounting region side surface 119a and lead region side surface 119b. The element-mounting region side surface 119a is more steeply inclined than the lead side surface 119b. Due to this, the projecting part 119 of the piezoelectric device 100 in the present embodiment can suppress the spread of the solder bumps 132.

Further, the metal pattern 118 of the piezoelectric device 100 in the present embodiment has the groove portion 117 disposed on the side by the lead region 118b other than the projecting part 119. Due to this, even if the solder forming the solder bumps 132 does not stop at the element-mounting region side surface 119a of the projecting part 119, the metal pattern 118 of the piezoelectric device 100 in the embodiment of the present invention stops the spread of the solder which forms the solder bumps 132 by the groove portion 117, therefore the spread of the solder to the lead region 118b can be suppressed.

Further, in the groove portion 117 of the piezoelectric device 100 in the present embodiment, as shown in FIG. 3, by formation of the plurality of minute rugged shapes, even when the solder bumps 132 spread over the element-mounting region side surface 119a, the spread of the solder bumps 132 can be suppressed by the plurality of minute rugged shapes of the groove portion 117. Further, in the groove portion 117 in the present embodiment, the plurality of minute rugged shapes are formed in a direction so that flow of the solder is suppressed, and the flow of the solder stops by the plurality of minute rugged shapes.

Second Embodiment

Figure 5:
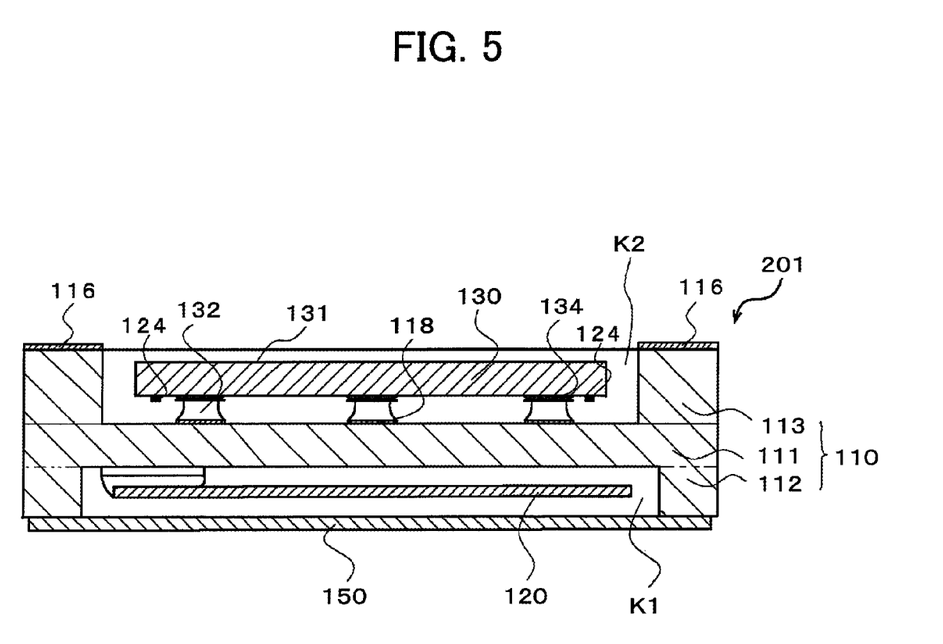
FIG. 5 is a vertical cross-sectional view which shows a piezoelectric device in a second embodiment of the present invention.

FIG. 5 is a cross-sectional view the same as FIG. 1 and shows a piezoelectric device 201 according to a second embodiment. Note that, in the second embodiment, with respect to components the same as or similar to the components in the first embodiment, the same notations as those in the first embodiment are sometimes attached, and the explanation will be sometimes omitted.

The piezoelectric device 201 differs from the piezoelectric device 100 in the first embodiment in only the point that a conductor pattern 124 is provided. Note that, the resin 140 is not provided in the piezoelectric device 201, but the resin 140 may be provided in the piezoelectric device 201.

Figure 6A:
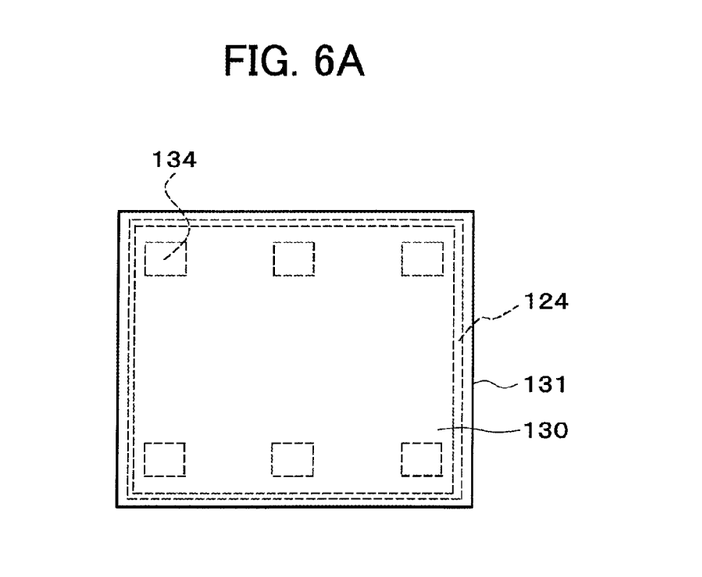
FIG. 6A is a plan view which shows an integrated circuit element in the piezoelectric device which is shown in FIG. 5.
Figure 6B:
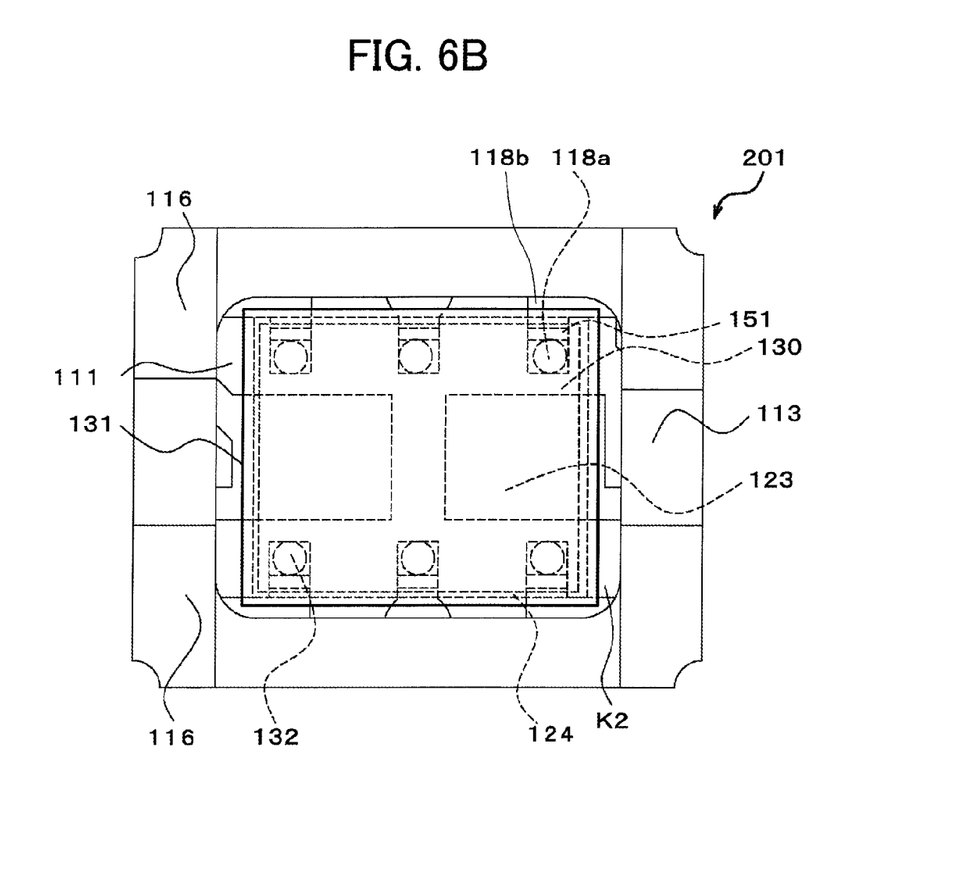
FIG. 6B is a plan view which shows an example of electrical connection of the integrated circuit element in the piezoelectric device shown in FIG. 5.

As shown in FIG. 6, the conductor pattern 124 is provided in an edge portion of the bottom surface (the surface on the side joined by the solder bumps 132) of the integrated circuit element 130. Note that, in the following description, a combination of the integrated circuit element 130 and conductor pattern 124 will be sometimes referred to as an "integrated circuit part 131". In FIG. 6, the plurality of electrode pads 134 and the conductor pattern 124 are indicated by broken lines in a state where they are seen through a portion of the integrated circuit element 130. For example, in a case where the integrated circuit element 130 is prepared by cutting it from a wafer, the conductor pattern 124 contributes to reduction of bending of the wafer. The conductor pattern 124 is grounded or brought to an electrically floating state.

Figure 7:
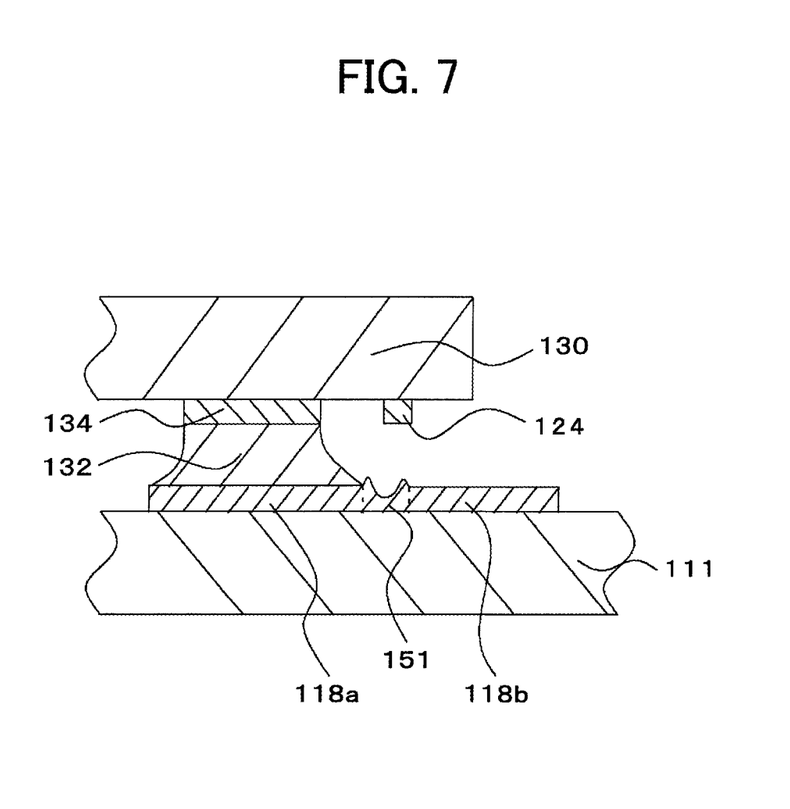
FIG. 7 is a vertical cross-sectional view which shows a joined state of a connection portion in the piezoelectric device shown in FIG. 5.

Here, with reference to FIG. 6B and FIG. 7, an explanation will be given of the position relationships among the plurality of electrode pads 134 and conductor pattern 124 of the integrated circuit element 130, the projecting parts 119 of the metal patterns 118 provided on the top surface of the substrate section 111, and so on in the piezoelectric device 201 of the present embodiment. Note that, in the following description, the projecting parts 119, the metal oxide having a relatively low wettability with solder or groove portion 117, or a combination of them will be sometimes referred to as a "solder flow preventing region 151".

The integrated circuit part 131 is provided in the second recess K2 as shown in FIG. 6B. Further, the plurality of electrode pads 134 of the integrated circuit element 130 are located in regions near long sides of the second recess K2. The conductor pattern 124 provided in the edge portion of the bottom surface of the integrated circuit element 130 is disposed so as to surround the plurality of electrode pads 134 outside of the plurality of electrode pads 134.

Here, the solder flow preventing region 151 is formed at a position where it overlaps the conductor pattern 124 or the inner side other than the conductor pattern 124. For example, at least the edge of the solder flow preventing region 151 which is oriented to the inside of the element-mounting member 110 is formed on the inner side other than the conductor pattern 124.

Accordingly, in the piezoelectric device 201 of the present embodiment, on the inner side other than the conductor pattern 124 of the integrated circuit element 130, flow of the solder is stopped by the solder flow preventing region 151 of the metal patterns 118, therefore the possibility of short-circuiting of the plurality of electrode pads 134 of the integrated circuit element 130 due to the conductor pattern 124 is reduced.

Other than the first and second embodiments described above, various modifications and alterations are also possible within a range not out of the gist of the present invention. For example, the metal pattern 118 having a three-layer structure was shown. However, for example, it may be a multi-layer structure such as a four-layer structure as well. Further, as the composition of the three-layer structure of the metal pattern 118 as well, for example, a structure in which molybdenum (Mo) was formed in the bottom layer, nickel (Ni) was formed in the intermediate layer, and gold (Au) was formed in the top layer was shown, but the composition is not limited to this and may be a combination of other metals as well. For example, the metal pattern 118 may be a combination of tungsten (W) in the bottom layer, copper (Cu) in the intermediate layer, and silver (Ag) in the top layer as well. Further, as the piezoelectric element 120 mounted in the first recess K1 of the piezoelectric device 100 or 201 shown in the above embodiments, the structure provided with some excitation-use electrode and some connection-use electrode on the two major surfaces of the piezoelectric element sheet in a rectangular state when viewed on a plane was shown. However, the invention is not limited to this and may be for example a piezoelectric element in a form wherein various types of electrodes are provided at a piezoelectric element sheet having a circular or tuning fork shape when viewed on a plane as well. Further, a surface acoustic wave element may be used in place of the piezoelectric element.

Further, the solder flow preventing region 151 may be configured by, other than formation by irradiation of the laser, formation of an insulation layer or metal layer on the metal patterns 118 and providing projecting parts etc. as well.

As the insulation layer, there can be mentioned for example a ceramic coat (for example alumina coat) or resin. The ceramic coat or resin is provided on the metal patterns 118 by screen printing. The ceramic coat or resin etc. are able to simultaneously form a plurality of insulation layers by screen printing, therefore it becomes possible to reduce the manufacturing cost. Note that, the insulation layer has a low wettability with solder in comparison with the metal patterns, therefore the outflow of solder can be reduced more.

Further, the metal layer is formed by for example an Al film or Cr film etc. by vacuum printing method such as sputtering or the like. The Al film or Cr film etc. are able to simultaneously form a plurality of metal layers by sputtering or the like, therefore it becomes possible to reduce the manufacturing cost.

Note that, in the method of formation by laser, the projecting part can be formed by shaving the metal pattern 118 by laser. Therefore, it is not necessary to separately prepare a material for forming the projecting parts, so an improvement of productivity by reduction of members becomes possible. Further, in the method of formation by laser, the projecting parts are formed by post processing for the element-mounting member 110 upon which the metal patterns 118 are formed, therefore the degree of freedom in the manufacture rises. For example, the position for forming the solder flow preventing region 151 can be determined corresponding to the size of the integrated circuit element 130.

REFERENCE SIGNS LIST 100, 201 . . . piezoelectric devices
110 . . . element-mounting member
111 . . . substrate section
112 . . . first frame section
113 . . . second frame section
114 . . . piezoelectric element mount-use pattern
116 . . . external connection terminal
117 . . . groove portion
118 . . . metal patterns
118a . . . element-mounting region
118b . . . lead region
119 . . . projecting part
119a . . . element-mounting region side surface
119b . . . lead region side surface
119c . . . recess
120 . . . piezoelectric element
121 . . . conductive binder
124 . . . conductor pattern
130 . . . integrated circuit element
132 . . . solder bump
134 . . . electrode pad
140 . . . resin
150 . . . lid member
151 . . . solder flow preventing region
K1 . . . first recess
K2 . . . second recess

The invention claimed is:

1. A piezoelectric device comprising:
an element-mounting member,
a piezoelectric element which is mounted on the element-mounting member,
a metal pattern which is formed on the surface of the element-mounting member and includes an element-mounting region and a lead region, and
an integrated circuit element which is electrically connected to the element-mounting region of the metal pattern by a solder bump, wherein
the metal pattern has a projecting part which is provided between the element-mounting region and the lead region, and at least the surface portion of the projecting part is made of a metal oxide.

2. The piezoelectric device as set forth in claim 1, wherein the projecting part has an element-mounting region side surface, the element-mounting region side surface has a plurality of recesses in a plan view, and each of the plurality of recesses is recessed so as to become narrower toward the direction of the lead region when in the plan view.

3. The piezoelectric device as set forth in claim 1, wherein the projecting part has an element-mounting region side surface and a lead region side surface, and the element-mounting region side surface is steeper than the lead side surface.

4. The piezoelectric device as set forth in claim 1, wherein the metal pattern has a groove portion provided on the lead region side other than the projecting part.

5. The piezoelectric device as set forth in claim 1, further comprising a conductor pattern provided on the integrated circuit element at its edge portion of the surface on the side connected to the metal pattern by the solder bump, and
the projecting part is provided at a position where it overlaps the conductor pattern or is at an inner side other than the conductor pattern.

6. The piezoelectric device as set forth in claim 1, wherein the projecting part is formed by irradiation of a laser.

7. A piezoelectric device comprising:
   an element-mounting member,
   a piezoelectric element which mounted on the element-mounting member,
   a metal pattern which is provided on the surface of the element-mounting member and includes an element-mounting region and a lead region, and
   an integrated circuit part including an integrated circuit element which is electrically connected to the element-mounting region of the metal pattern by a solder bump and including a conductor pattern which is provided on the integrated circuit element at its edge portion of the surface on the side connected to the metal pattern by the solder bump, wherein
   the metal pattern further includes a solder flow preventing region which is provided between the element-mounting region and the lead region, and
   the solder flow preventing region is provided at a position where it overlaps the conductor pattern of the integrated circuit part or is at an inner side other than the conductor pattern in a plan view.

\* \* \* \* \*